(12) United States Patent
Saitoh et al.

(10) Patent No.: US 6,465,042 B2
(45) Date of Patent: Oct. 15, 2002

(54) MATERIAL HAVING TITANIUM DIOXIDE CRYSTALLINE ORIENTATION FILM AND METHOD FOR PRODUCING THE SAME

(75) Inventors: Hidetoshi Saitoh; Shigeo Ohshio; Norio Tanaka; Hideki Sunayama, all of Niigata (JP)

(73) Assignees: Kousei Co., Ltd., Tsubame (JP); Hidetoshi Saitoh, Nagaoka (JP)

( * ) Notice: Subject to any disclaimer, the term of this patent is extended or adjusted under 35 U.S.C. 154(b) by 0 days.

(21) Appl. No.: 09/776,857

(22) Filed: Feb. 6, 2001

(65) Prior Publication Data

US 2001/0012567 A1 Aug. 9, 2001

Related U.S. Application Data

(62) Division of application No. 09/035,906, filed on Mar. 6, 1998, now Pat. No. 6,228,502.

(30) Foreign Application Priority Data

Jun. 24, 1997 (JP) .............................. 9-181858

(51) Int. Cl.⁷ .............................. C23C 16/18
(52) U.S. Cl. .............................. 427/255.19; 427/255.11; 427/255.23; 427/255.28; 427/255.395; 427/422
(58) Field of Search .............................. 427/421, 422, 427/424, 427, 255.11, 255.19, 255.23, 255.28, 255.395; 118/724

(56) References Cited

U.S. PATENT DOCUMENTS

| 3,650,815 A | | 3/1972 | Ghoshtagore et al. ...... 117/106 |
| 4,147,835 A | | 4/1979 | Nishino et al. ............. 428/450 |
| 4,263,872 A | * | 4/1981 | Ban ........................... 118/721 |
| 5,090,985 A | * | 2/1992 | Soubryand et al. ........ 65/60.52 |
| 5,352,490 A | * | 10/1994 | Abe et al. ................... 427/251 |
| 5,650,126 A | | 7/1997 | Taoda et al. ................. 422/122 |
| 5,670,206 A | | 9/1997 | Taoda et al. ................. 427/106 |
| 5,728,222 A | * | 3/1998 | Barbee et al. .............. 118/715 |

FOREIGN PATENT DOCUMENTS

| DE | 44 10 476 | | 10/1994 |
| GB | 2 184 748 | | 7/1987 |
| JP | 61-136995 | | 6/1986 |
| JP | 40225531 A | | 10/1990 |
| JP | 404367262a | | 12/1992 |
| JP | 5-263247 | | 10/1993 |
| JP | 406107498 A | | 4/1994 |
| JP | 6-340422 | | 12/1994 |
| JP | 4080133730 A | | 5/1996 |
| JP | 409000920 A | * | 1/1997 |
| WO | WO 94/04356 | | 3/1994 |

OTHER PUBLICATIONS

H. Sunayama et al., Orientation control of titanium oxide polycrystalline films, Proceedings of Annual Meeting of the Ceramic Society of Japan, Oct. 7–9, 1996.

(List continued on next page.)

*Primary Examiner*—Deborah Jones
*Assistant Examiner*—Stephen Stein
(74) *Attorney, Agent, or Firm*—Armstrong, Westerman & Hattori, LLP

(57) ABSTRACT

A material having a titanium dioxide crystalline orientation film oriented in a specific direction on a surface of a substrate is produced by spraying a vaporized titanium alkoxide onto the surface of the substrate heated under atmospheric pressure along with an inert gas as a carrier. The material having the titanium dioxide crystalline orientation film is excellent in properties such as an antimicrobial activity, a stain resistance, an ultra-hydrophilic property and the like, and is widely used as kitchen appliances such as cooking utensils, tableware and a refrigerator, tools for medical care, materials for a toilet or a toilet room, a filter of an air-conditioner, electronic parts, building materials and road-associated materials.

6 Claims, 18 Drawing Sheets

(1 of 18 Drawing Sheet(s) Filed in Color)

OTHER PUBLICATIONS

Jiong–Ping Lu et al., Solution precursor chemical vapor deposition of titanium oxide thin films, Thin Solid Films, vol. 204, No. 1, Sep. 20, 1991, pp. L13–L17.

K. Fukushima et al., Electrical properties of $TiO_2$ films deposited by a reactive–ionized cluster beam, Journal of Applied Physics, vol. 65, No. 2, Jan. 15, 1989, pp. 619–623.

M. Sasase et al., Surface morhology of $TiO_x$ films prepared by an ion–beam–assisted reactive deposition method, Thin Solid Films, vol. 281/282, No. 1/02, Aug. 1, 1996, pp. 431–435.

A.A. Soliman et al., Reactive sputtering of titanium and properties of titanium suboxide films for photochemical applications, Thin Solid Films, vol. 100, No. 1 Feb. 1983, pp. 33–42.

K. Kamata et al., Synthesis of $TiO_2$ Films by Laser CVD, Journal of the Ceramic Society of Japan, International Edition, vol. 97, No. 12, Dec. 1, 1989, pp. 1544–1546.

A. Moussi et al., $TiO_2$ Antireflection Layers Sprayed on Textured Surface, Proceedings of the International Photovoltaic Solar Energy Conference, Florence, May 9–13, 1988, vol. II, pp. 1374–1377.

H. Ichinose et al., Properties of Anatase Films for Photocatalyst from Peroxotitanic Acid Solution and Peroxo–Modified Anatase Sol, Journal of the Ceramic Society of Japan, International Edition, vol. 104, No. 10, Oct. 1996, pp. 909–912.

Kiichiro Kamata et al., Synthesis of $TiO_2$ Films by Laser CVD, Nihon Ceramics Kyokai Gakujutsu Ronbushi (Journal of Japan Ceramics Association Academic Articles), 97 [12] pp. 1534–1536 (1989).

* cited by examiner

MATERIAL HAVING TITANIUM DIOXIDE CRYSTALLINE ORIENTATION FILM AND METHOD FOR PRODUCING THE SAME

This application is a division of prior application Ser. No. 09/035,906 filed Mar. 6, 1998 now U.S. Pat. No. 6,228,502.

FIELD OF THE INVENTION

The present invention relates to a material having a crystalline orientation film formed of titanium dioxide on a surface of a substrate such as a metal, a glass, a pottery, ceramics, plastics or the like. The material having the titanium dioxide crystalline orientation film is excellent in properties such as an antimicrobial activity, a stain resistance, an ultra-hydrophilic property and the like, and is widely used as kitchen appliances such as cooking utensils, tableware and a refrigerator, tools for medical care, materials for a toilet or a toilet room, a filter of an air-conditioner, electronic parts, building materials and road-associated materials.

BACKGROUND OF THE INVENTION

It has been so far known that a titanium dioxide thin film exhibits various functions through a photocatalytic reaction. It has been also known that the titanium dioxide thin film is formed on a surface of a substrate such as a metallic material, a semiconductor element, a plastic material or the like and is used as an antireflection material, a sensor material, an insulating material or the like. Further, as a method for forming a titanium dioxide thin film on the surface of such a substrate, a coating method, a dipping method, a sputtering method and a CVD method in which a metallic heat-evaporated vapor is introduced into an oxygen gas atmosphere for reaction have been known.

Of these conventional methods for forming a titanium dioxide thin film, the coating method and the dipping method cannot form a titanium dioxide crystalline orientation film, and the sputtering method can hardly control the crystal structure of the thin film obtained. In the conventional CVD method, in order to form a crystalline titanium oxide thin film on a surface of a substrate, it was required that a substrate is usually heated at a high temperature of from 500 to 800° C. and the formation of the thin film is conducted under reduced pressure in a closed plating chamber. In this conventional CVD method, the deposition rate of the titanium dioxide thin film was quite low, and the crystal structure of the thin film obtained was hardly controlled, making it impossible to obtain a crystalline orientation film oriented in a specific direction.

SUMMARY OF THE INVENTION

It is therefore an object of the present invention to provide a material having a titanium dioxide crystalline orientation film oriented in a specific direction on a surface of a substrate.

A further object of the present invention is to provide a method for preparing a material having a titanium dioxide crystalline orientation film oriented in a specific direction on a surface of a substrate efficiently at a low temperature.

The present inventors have found that the resulting titanium dioxide crystalline orientation film oriented in the specific direction is excellent in properties such as an antimicrobial activity, a stain resistance, an ultra-hydrophilic property and the like.

The material having the titanium dioxide crystalline orientation film on the surface of the substrate in the present invention is characterized in that the crystalline orientation film is oriented in the direction selected from crystal faces (001), (100), (211), (101) and (110) at right angles to the crystal surface. Thus, the excellent properties such as the outstanding antimicrobial property, stain resistance and the like can be provided for the first time by forming the titanium dioxide crystalline orientation film oriented in the above-mentioned specific direction on the surface of the substrate. Examples of the substrate include a metal, a glass, a pottery, ceramics, plastics, and a product having a film formed through plating with silver, chromium and the like on the surface of the above-mentioned substrate.

The titanium dioxide crystalline orientation film of the present invention refers to an orientation film formed of titanium dioxide single crystals or an orientation film formed of titanium oxide polycrystals. The single crystalline orientation film here referred to includes, as ordinarily used in the field of materials, not only one composed of single crystals but also one composed of plural crystals of which the three-dimensional crystal directions are consistent.

The material having the titanium dioxide crystalline orientation film which is oriented in the specific direction in the present invention can be produced for the first time by spraying a vaporized titanium alkoxide (starting complex) onto a surface of a substrate heated under atmospheric pressure along with an inert gas as a carrier.

BRIEF DESCRIPTION OF THE DRAWINGS

The patent or application file contains at least one drawing executed in color. Copies of this patent or patent application with color drawing(s) will be provided by the Office upon request and payment of the necessary fee.

DETAILED DESCRIPTION OF THE PREFERRED EMBODIMENTS

Figure 1:
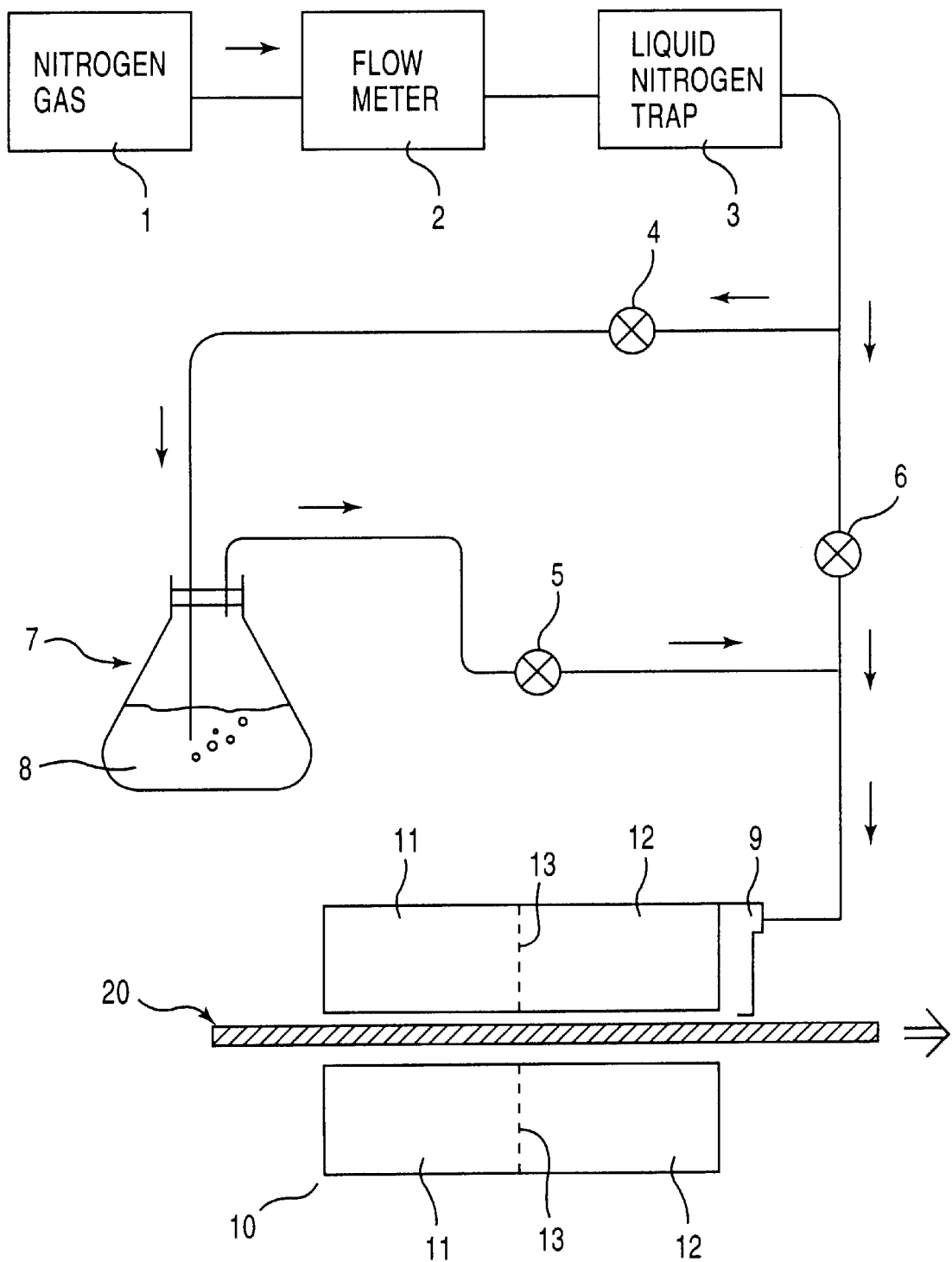
FIG. 1 is a schematic diagram of an atmospheric CVD apparatus used to produce a material having a titanium dioxide crystalline orientation film in the present invention.

A substrate which is used as a material having a titanium dioxide crystalline orientation film in the present invention is not particularly limited, and any material will do if it can withstand heating when spraying titanium dioxide. Usually, a metal, a glass, ceramics, a pottery, plastics and the like are used. Of these materials, a metal such as a stainless steel, a steel or the like is especially preferable in view of an adhesion to a titanium dioxide crystalline orientation film and a processability after formation of an orientation film. Further, it is preferable that a coating is formed on a surface of a material, especially, a metallic material through platinum-plating, silver-plating or chromium-plating, because a titanium dioxide crystalline orientation film having an improved photocatalytic activity can be provided. (Preferred thickness of the coating is from about 1 nm to about 5 $\mu$m.)

As a starting material to form a titanium dioxide crystalline orientation film, a titanium alkoxide is used which is represented by the formula Ti(OR)$_4$ wherein R represents an alkyl group having from 2 to 10 carbon atoms.

Preferable examples of the titanium alkoxide include Ti(OC$_2$H$_5$)$_4$ (hereinafter abbreviated as "TTE"), Ti(O—i—C$_3$H$_7$)$_4$ (hereinafter abbreviated as "TTIP") and Ti(O—n—C$_4$H$_9$)$_4$ (hereinafter abbreviated as "TTNB"). Of these, TTIP is especially preferable because a deposition rate of titanium dioxide is high and the crystal structure of the resulting orientation film can easily be controlled.

In the present invention, the above-mentioned starting complex is vaporized using a vaporizer, and sprayed onto a surface of a substrate heated under atmospheric pressure along with an inert gas as a carrier to form a titanium dioxide crystalline orientation film on the surface of the substrate. The inert gas as a carrier is not particularly limited, and ordinary inert gases such as nitrogen, helium, argon and the like are available. It is preferable to use a nitrogen gas in view of economics. A nitrogen gas obtained by removing moisture though liquid nitrogen is especially preferable.

The vaporization temperature of the starting complex is adjusted depending on the type of the starting material. In the case of TTE, TTIP and TTNB, for example, a temperature of from 70 to 150° C. is preferable.

When the starting complex fed with the inert gas carrier is sprayed onto the surface of the substrate heated under atmospheric pressure, it is sprayed onto the surface of the substrate which is moved from a slit-like nozzle. In this manner, the titanium dioxide crystalline orientation film can continuously be formed on the surface of the plate-like, bar-like, linear or pipe-like substrate or on the surface of the substrate which has been formed into a plate, a tray or the like.

In order to heat the surface of the substrate, it is preferable to use a heating oven 10 (usually an electric oven) consisting of zones 11, 11 of a lower temperature (usually 300° C. or less) and zones 12, 12 of a higher temperature (usually an oven inner temperature of from 400 to 500° C.) than that of the above-mentioned lower-temperature zones. This heating oven is provided at the lower-temperature zone side with an inlet of a substrate and at the higher-temperature zone side with an outlet of a substrate. When the substrate is continuously passed through the heating oven, this substrate is preliminarily heated in the lower-temperature zones, and the vaporized starting complex is sprayed onto the surface of the substrate from a slit-like nozzle 9 along with an inert gas to form a crystalline orientation film. Partitions 13, 13 are mounted between the lower-temperature zones 11, 11 and the higher-temperature zones 12, 12 to prevent the starting material of the higher-temperature zones from flowing into the lower-temperature zones. The substrate 20 to be coated is usually moved within the heating oven while being mounted on a transporting body such as a roller, a belt or a chain. At this time, the shape of the passage in the heating oven may appropriately be changed depending on the form of the substrate. For obtaining a uniform crystalline orientation film, it is advisable to reciprocate the nozzle on the surface of the substrate.

In the conventional CVD method, a substrate was heated in a closed plating chamber at a high temperature of from 500 to 800° C. under reduced pressure to form a titanium dioxide thin film on the surface of the substrate. Accordingly, the material which could be used as the substrate was limited, and a long product could not be provided. Further, since the deposition rate of the titanium dioxide thin film was quite low, the crystal structure of the thin film could not be controlled.

In the method of the present invention, the titanium dioxide crystalline orientation film is continuously formed at a high rate on the surface of the substrate heated at a relatively low temperature under atmospheric pressure. Accordingly, not only heat-resistant materials such as a metal, a glass, a pottery or ceramics, but also a material having a relatively low heat resistance, such as plastics, can be used. Further, a long product such as a plate or a pipe can continuously be produced. Still further, a vaporization temperature and a feed rate of a starting material, a flow rate of a carrier gas and a substrate temperature are controlled, making it possible to adjust the crystal structure, the orientation direction and the thickness of the resulting crystalline orientation film and the particle diameter and the particle diameter distribution of the crystal as required.

In addition, when the titanium dioxide crystalline orientation film is formed using the substrate composed of the material having the single crystalline orientation film on the surface, the material having the titanium dioxide single crystalline orientation film can be obtained. As the substrate having the single crystalline orientation film, for example, a strontium titanate plate is mentioned, and it is commercially available.

The present invention can provide the crystalline orientation film which is oriented in the direction selected from crystal faces (001), (100), (211), (101) and (110) at right angles to the crystal surface. It has been found that the titanium dioxide crystalline orientation film which is oriented in the specific direction unexpectedly exhibits the following various photocatalytic activities when this film is irradiated with a light, especially, an ultraviolet light.

(1) Since the orientation film has an outstanding antimicrobial activity (control of growth and sterilization) and can degrade dead microbes or products of microbes such as toxin and the like, contamination is prevented, and a persistent antimicrobial activity is exhibited.

(2) The orientation film prevents adhesion of a stain and degrades a stain adhered. The stain is easily removed with a rain that falls naturally or through water-washing, maintaining the gloss of the surface.

(3) The orientation film degrades a material that gives an odor, and has a deodorant activity.

(4) In the orientation film, the contact angle with water adhered to the surface is reduced and close to 0° through irradiation with an ultraviolet light, so that the film does not repel water. Consequently, no droplet is formed on the surface of the orientation film, and the film becomes a uniform aqueous film, making it possible to prevent cloudiness.

(5) The orientation film degrades nitrogen oxide (NOx) or sulfur oxide (SOx) in air, cleaning air.

(6) The orientation film degrades organic halogen compounds or contaminants in water such as an oil and the like, cleaning water.

Accordingly, the material having the titanium dioxide crystalline orientation film oriented in the specific direction on the surface can widely be used as tools for medical care, kitchen appliances such as tableware, cooking utensils and a refrigerator, a refrigerator car, materials for a toilet or a toilet room, building materials such as interior or exterior materials, road-associated materials, a filter of an air-conditioner, electronic parts and the like.

The material having the titanium dioxide crystalline orientation film oriented in the specific direction on the surface brings forth the same effects whether it is formed of titanium dioxide crystals oriented in one direction or of titanium dioxide crystals oriented in two or more directions.

According to the present invention, the crystalline orientation film formed on the surface of the substrate can have any desired thickness. When the film thickness is 0.1 $\mu$m or more, various properties including the antimicrobial activity can be imparted to the substrate. Thus, it is usually between 0.1 and 10 $\mu$m, preferably between 0.2 and 2.0 $\mu$m.

When the particle diameter of the crystal forming the orientation film is approximately the same as the wavelength of a visible light or an ultraviolet light, an outstanding antimicrobial activity can be obtained. Especially, in the case of the crystalline orientation film having a uniform particle diameter distribution, its effect is remarkable. Accordingly, preferable is a crystalline orientation film in which the particle diameter of the crystal is between 0.1 and 10 $\mu$m and the particle diameter distribution is substantially an average value±100%. Especially preferable is a crystalline orientation film in which the particle diameter distribution is an average value±50%.

Figure 20:
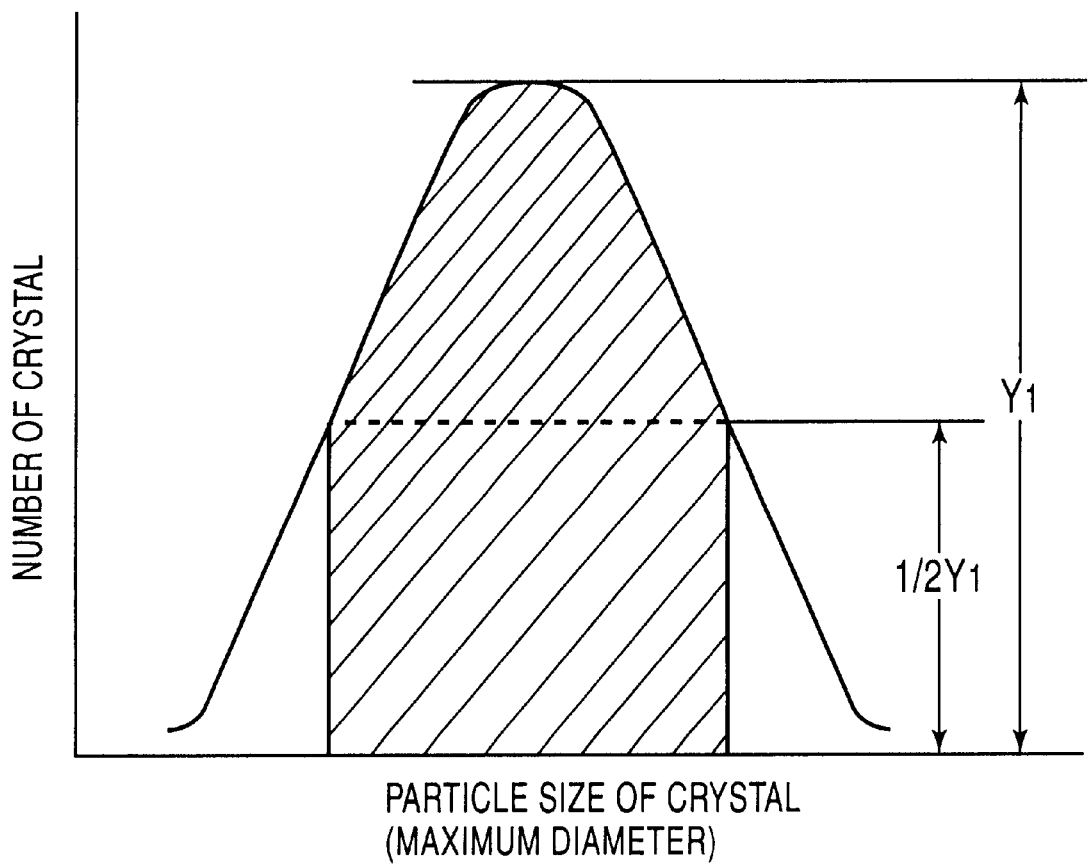
FIG. 20 is a graph illustrating a method for calculating a particle diameter distribution of a crystal.

The particle diameter distribution of crystals in the present invention is calculated as follows according to a usual method in the field of materials. That is, as shown in FIG. 20, in a histogram in which a particle diameter (maximum diameter) of each crystal constituting an orientation film is plotted as abscissa and the number of crystals as ordinate, the average value of the crystal particle diameter and the particle diameter distribution are calculated with respect to crystals of which the number is 50% or more of a maximum value $Y_1$ in the ordinate (hatched portion in FIG. 20).

Further, another preferable material is one in which a titanium dioxide crystalline orientation film has a network structure. This material can be obtained by forming the titanium dioxide crystalline orientation film on the surface of the substrate, and then conducting annealing in an oxygen atmosphere as required.

In the crystalline orientation film having the network structure in the present invention, needle crystals are intersected, or arranged in a honeycomb state.

In the annealing in the oxygen atmosphere, the titanium dioxide crystalline orientation film is heated in an oxygen stream at a temperature of from 300° C. to 600° C. for several hours under atmospheric pressure using an electric oven.

It has been so far known that a titanium dioxide thin film formed on a substrate has a photocatalytic activity and that such a material is used as a antireflection film, a sensor material or the like. However, according to the present invention, it has been possible for the first time that a titanium dioxide crystalline orientation film oriented in a specific direction is formed on a substrate and that this crystalline orientation film exhibits outstanding properties which were not provided by the conventional titanium dioxide thin film.

The reason that the titanium dioxide thin film oriented in the specific direction in the present invention exhibits such various properties is unknown. It is considered that titanium dioxide on the surface layer oriented in the specific direction is excited through the irradiation with a light, especially an ultraviolet light, and polarized into a positive ion and an electron.

When a coating of silver, copper or an oxide thereof is formed on the surface of the titanium dioxide crystalline orientation film, a material having quite an improved antimicrobial activity can be obtained. In the formation of the coating of silver, copper or the oxide thereof on the surface of the titanium dioxide crystalline orientation film, the titanium dioxide crystalline orientation film is first formed by the above-mentioned method, and then cut or formed into a desired shape as required. The coating of silver, copper or the oxide thereof is formed on the titanium dioxide crystalline orientation film by a usual method such as a coating method, a dipping method, a sputtering method or a CVD method. It is preferable that the coating of silver or copper is formed by the sputtering method and the coating of the oxide thereof by the same method as that of the present invention.

EXAMPLES

The following Examples further describe and demonstrate the preferred embodiments within the scope of the present invention. The Examples are given solely for the purpose of illustration, and are not to be construed as limitations of the present invention, since many variations thereof are possible without departing from its spirit and scope.

FIG. 1 is a schematic diagram showing an atmospheric CVD apparatus used in the following Examples. In FIG. 1, 1 is a nitrogen gas feed source such as a bomb; 2 a flowmeter; 3 a trap containing liquid nitrogen; 4, 5, 6 valves mounted in a pipe; 7 a vaporizer of a titanium alkoxide 8 as a starting material; 9 a slit-like nozzle provided on the lower portion with a slit having a predetermined width; and 10 a heating oven (electric oven) consisting of lower-temperature zones 11, 11 and higher-temperature zones 12, 12, partitions 13, 13 being provided between both zones.

A nitrogen gas fed from the nitrogen gas feed source 1 is fed to the trap 3 containing the liquid nitrogen through the flowmeter 2, and supplied to the valves 4, 6 after the removal of moisture. The nitrogen gas passed through the valve 4 is released as bubbles into the liquid titanium alkoxide 8 in the vaporizer 7 to help vaporize the titanium alkoxide. The mixed gas of the titanium alkoxide vaporized and the nitrogen gas is mixed with a nitrogen gas fed from the valve 6 through the valve 5, and fed to the slit-like nozzle 9. The substrate 20 is continuously supplied from the inlet formed at the lower-temperature zone 11 side of the heating oven 10 into the heating oven 10, and preliminarily heated in the lower-temperature zones 11, 11. Thereafter, the mixed gas of the starting complex and the nitrogen gas is sprayed onto the surface from the slit-like nozzle 9 mounted near the outlet of the higher-temperature zone 12 to form the titanium dioxide crystalline orientation film.

Example 1

TTIP was used as a starting complex, and vaporized at a starting material vaporization temperature of 77° C. with a nitrogen gas flow rate of 1.5 dm$^3$/min. A belt-like stainless steel having a thickness of 0.5 mm and a width of 10 mm was conveyed as a substrate into a heating oven in which the temperature of the lower-temperature zone was set at 300° C. and that of the higher-temperature zone at 400° C. at a rate of 0.2 m/min. The above-mentioned starting gas mixture was sprayed from a slit-like nozzle having a slit 0.5 mm in width to form a titanium dioxide polycrystalline orientation film having a thickness of 2.0 μm on the surface of the substrate.

Figure 2:
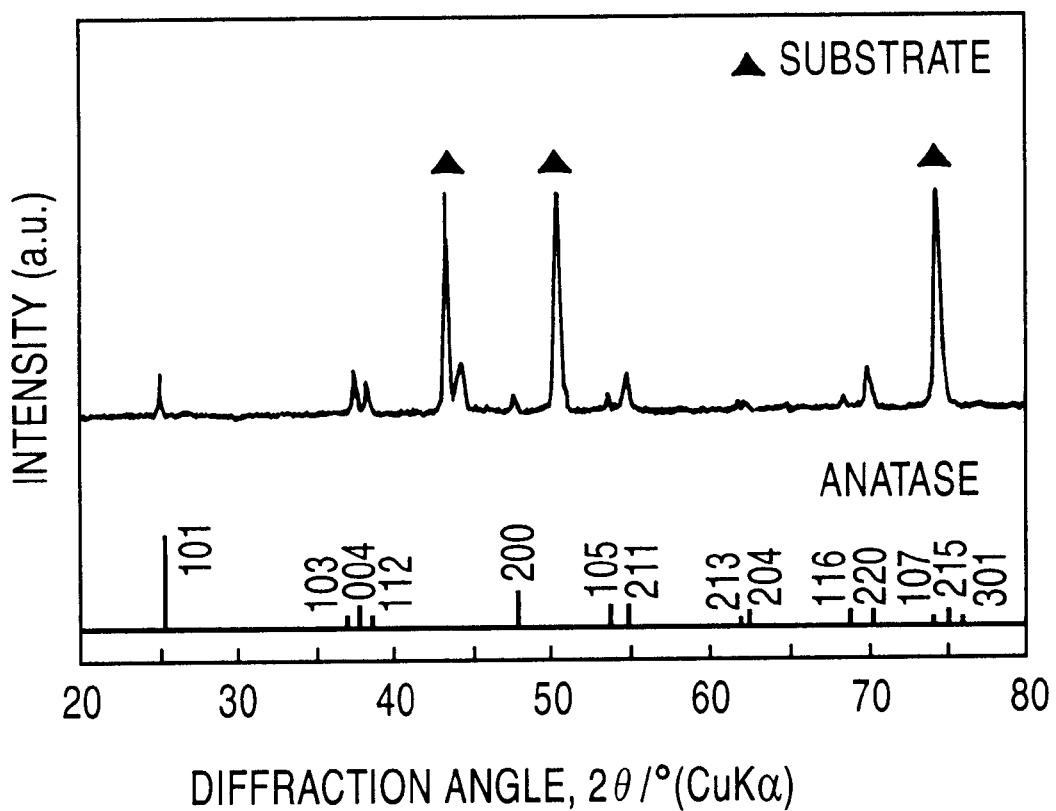
FIG. 2 is an X-ray diffraction pattern of an example of a titanium dioxide polycrystalline orientation film formed on a surface of a material in accordance with the present invention.
Figure 3:
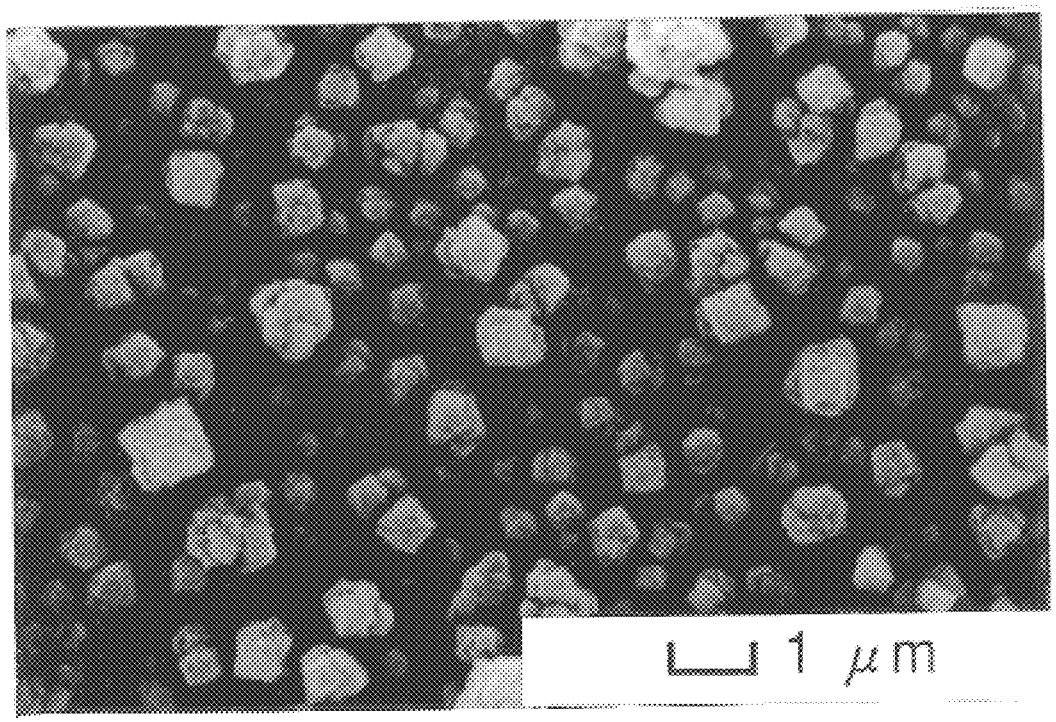
FIG. 3 is a scanning electron microscope (hereinafter abbreviated as "SEM") photo of the titanium dioxide polycrystalline orientation film in FIG. 2.

The condition of the resulting titanium dioxide polycrystalline orientation film was observed using SEM and X-ray diffraction. Consequently, the polycrystalline orientation film had an anatase structure, and was oriented in (001) face at right angles to the surface of the crystal forming the film. Further, the particle diameter of the crystal was between 0.3 and 0.8 μm, and the particle diameter distribution was 0.55±0.25 μm. The results of the X-ray diffraction of this polycrystalline orientation film are shown in FIG. 2, and the SEM photo of the surface in FIG. 3 respectively.

Example 2

The stainless steel having the titanium dioxide polycrystalline orientation film obtained in Example 1 was annealed in an oxygen atmosphere at a temperature of 500° C. for 10 hours.

Example 3

Figure 4:
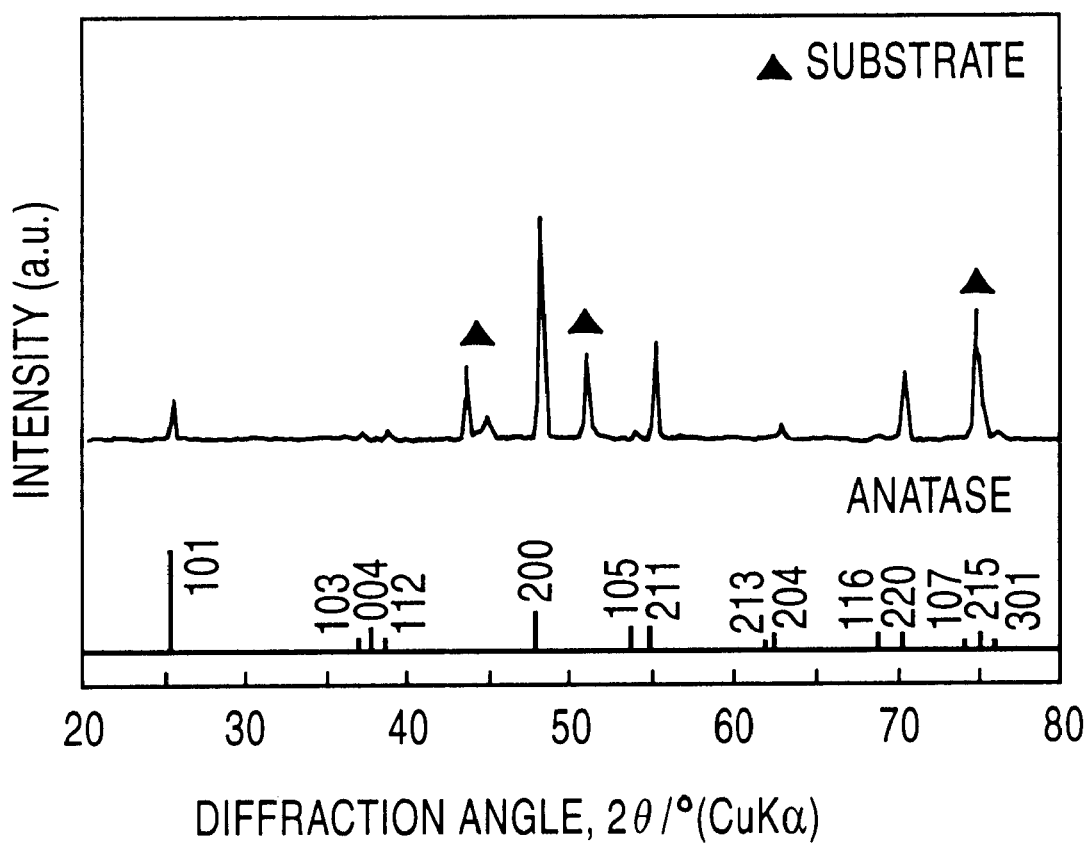
FIG. 4 is an X-ray diffraction pattern of another example of a titanium dioxide polycrystalline orientation film formed on a surface of a material in accordance with the present invention.
Figure 5:
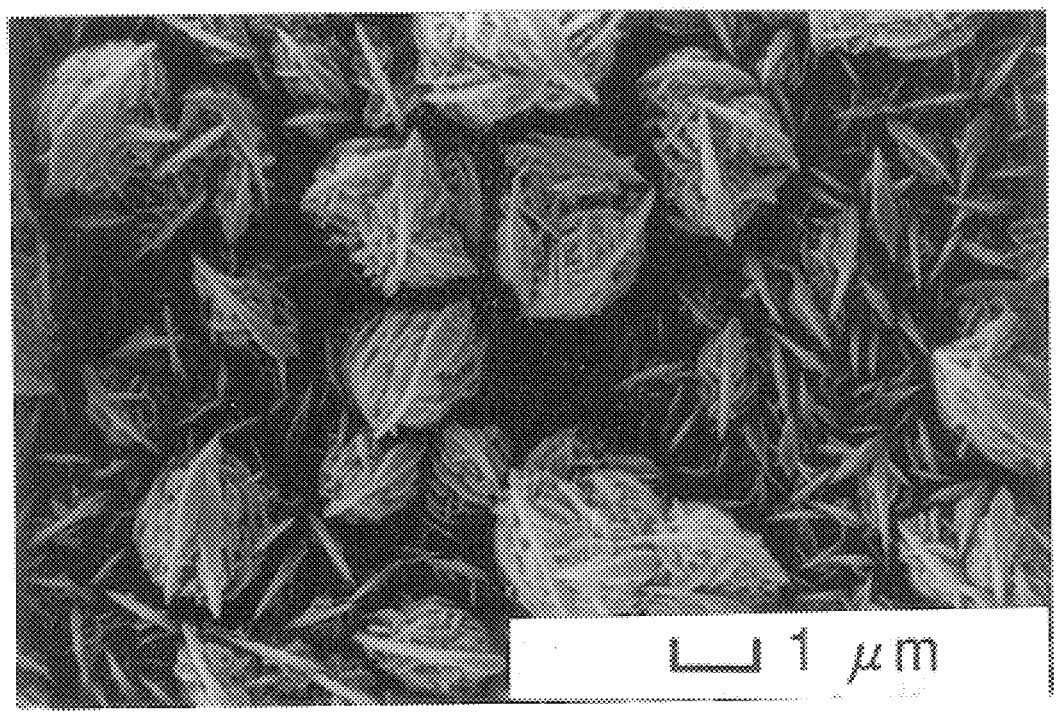
FIG. 5 is a SEM photo of the titanium dioxide polycrystalline orientation film in FIG. 4.

Example 1 was repeated except that the starting material vaporization temperature was set at 130° C. to form a titanium dioxide polycrystalline orientation film having a thickness of 3.0 μm on the surface of the stainless steel. The condition of this orientation film was observed using SEM and X-ray diffraction. Consequently, the polycrystalline orientation film had an anatase structure, and was oriented in (100) and (211) faces at right angles to the surface of the crystal forming the film. Further, the particle diameter of the crystal was between 1.2 and 1.5 μm, and the particle diameter distribution was 1.35±0.15 μm. The results of the X-ray diffraction of this polycrystalline orientation film are shown in FIG. 4, and the SEM photo of the surface in FIG. 5 respectively. FIG. 5 reveals that this polycrystalline orientation film has a network structure.

Example 4

The stainless steel having the titanium dioxide polycrystalline orientation film obtained in Example 3 was annealed in an oxygen atmosphere at a temperature of 500° C. for 10 hours.

Example 5

Figure 6:
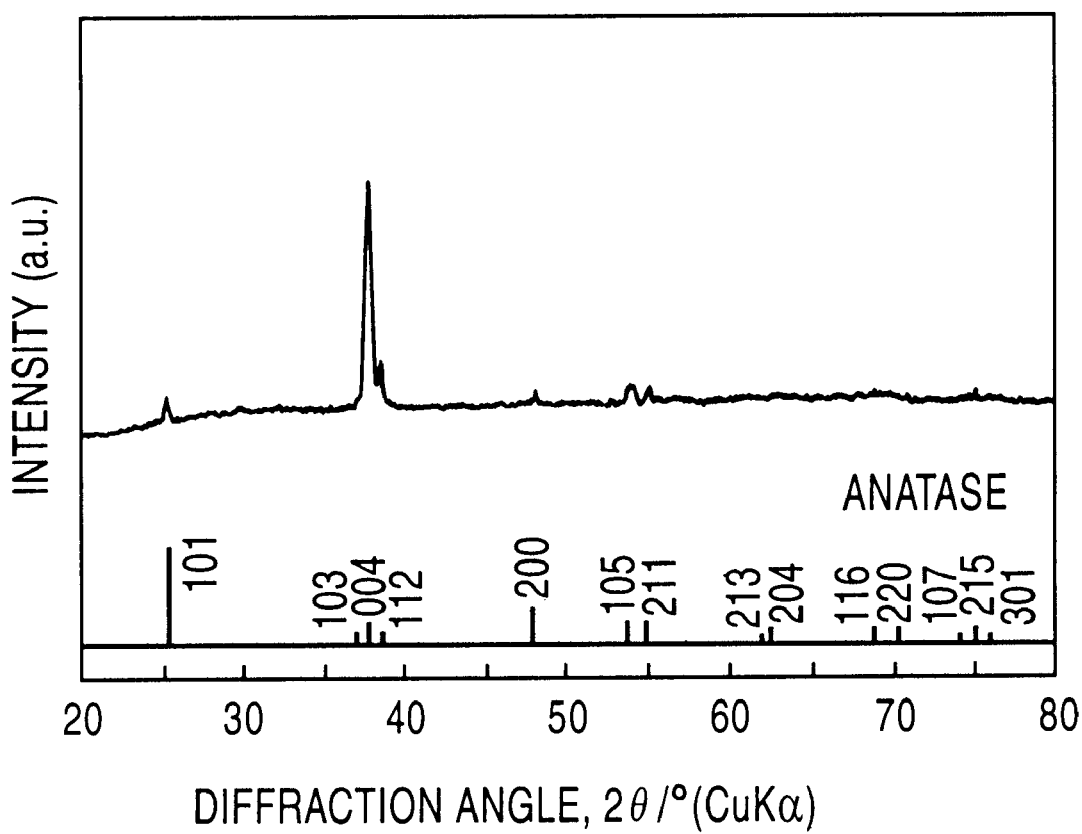
FIG. 6 is an X-ray diffraction pattern of still another example of a titanium dioxide polycrystalline orientation film formed on a surface of a material in accordance with the present invention.
Figure 7:
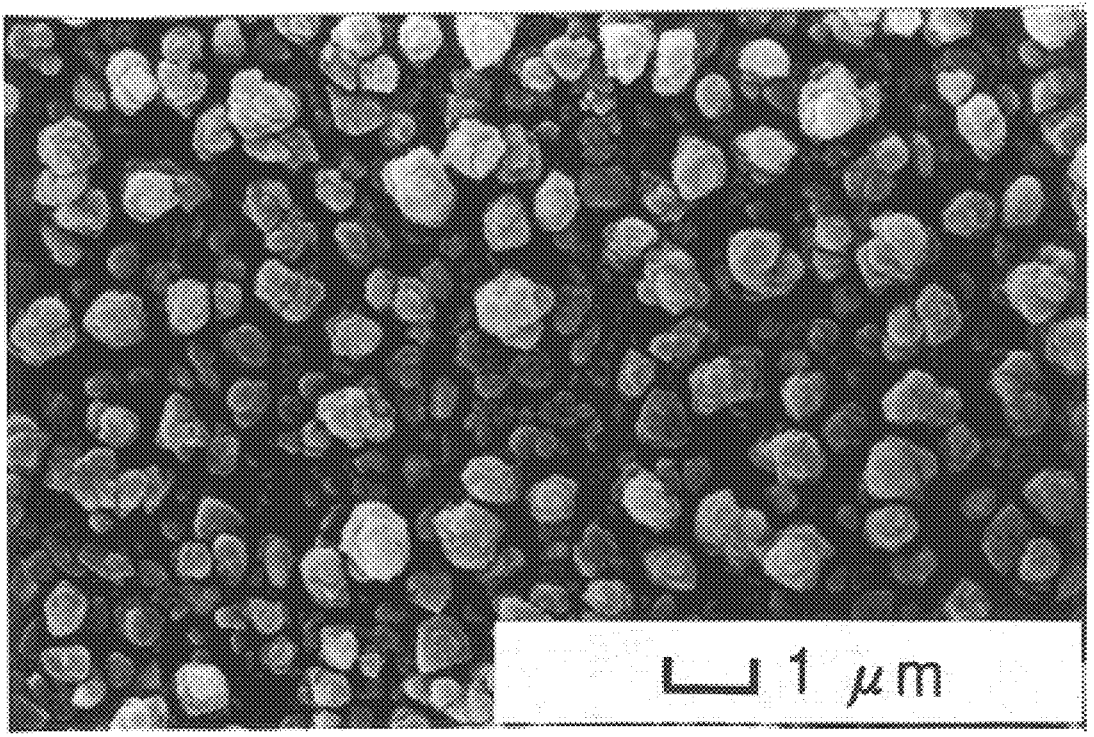
FIG. 7 is a SEM photo of the titanium dioxide polycrystalline orientation film in FIG. 6.

Example 1 was repeated except that TTE was used as a starting complex and the starting material vaporization temperature was set at 92° C. to form a titanium dioxide polycrystalline orientation film having a thickness of 2.0 μm on a surface of a glass substrate having a thickness of 1.0 mm, a width of 26 mm and a length of 76 mm. The condition of this orientation film was observed using SEM and X-ray diffraction. Consequently, the polycrystalline orientation film had an anatase structure, and was oriented in (001) face at right angles to the surface of the crystal forming the film. Further, the particle diameter of the crystal was between 0.3 and 0.7 μm, and the particle diameter distribution was 0.5±0.2 μm. The results of the X-ray diffraction of this polycrystalline orientation film are shown in FIG. 6, and the SEM photo of the surface in FIG. 7 respectively.

Example 6

The glass substrate having the titanium polycrystalline orientation film obtained in Example 5 was annealed in an oxygen atmosphere at a temperature of 500° C. for 10 hours.

Example 7

Figure 8:
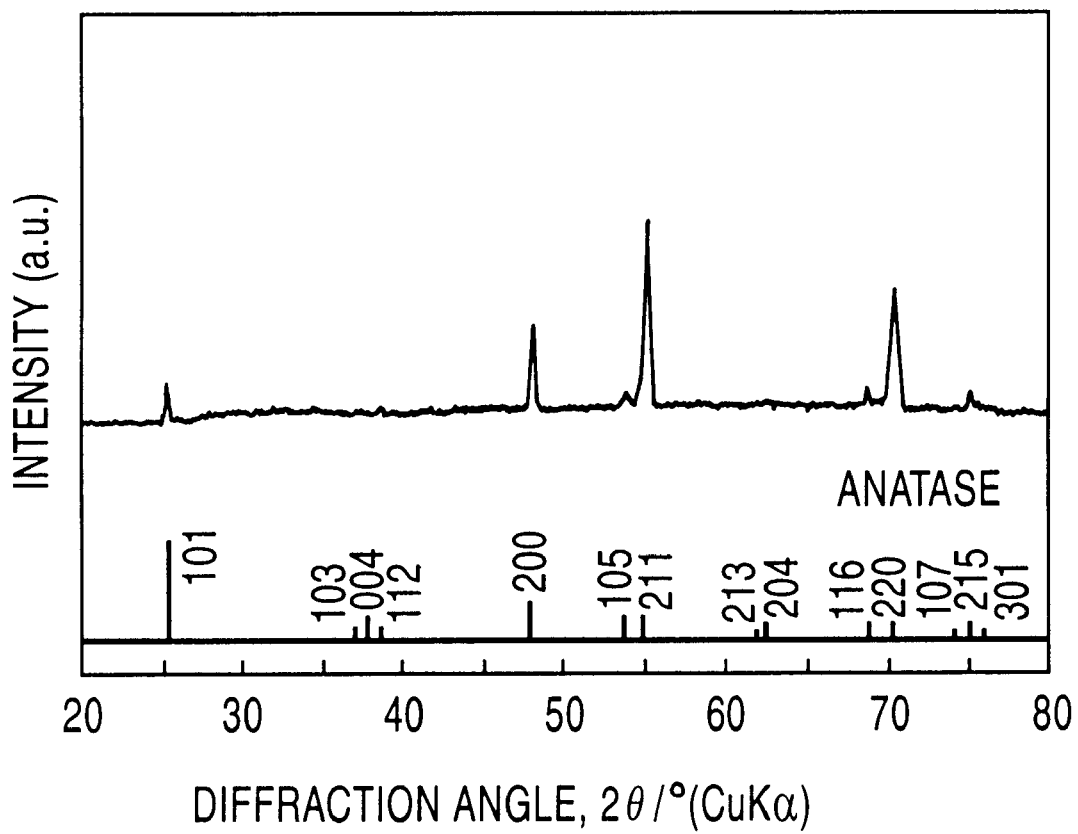
FIG. 8 is an X-ray diffraction pattern of another example of a titanium dioxide polycrystalline orientation film formed on a surface of a material in accordance with the present invention.
Figure 9:
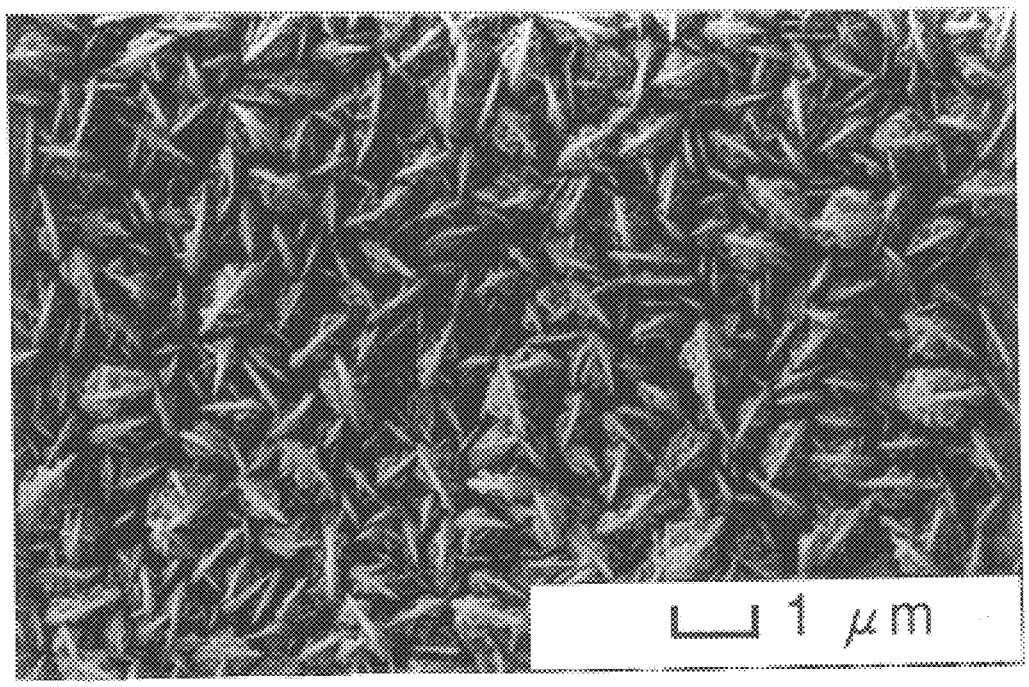
FIG. 9 is a SEM photo of the titanium dioxide polycrystalline orientation film in FIG. 8.

Example 3 was repeated except that the starting material vaporization temperature was set at 162° C. to form a titanium dioxide polycrystalline orientation film having a thickness of 2.0 μm on a surface of a glass substrate. The condition of this orientation film was observed using SEM and X-ray diffraction. Consequently, the polycrystalline orientation film had an anatase structure, and was oriented in (100) and (211) faces at right angles to the surface of the crystal forming the film. Further, the particle diameter of the crystal was between 0.8 and 1.0 μm, and the particle diameter distribution was 0.9±0.1 μm. The results of the X-ray diffraction of this polycrystalline orientation film are shown in FIG. 8, and the SEM photo of the surface in FIG. 9 respectively. FIG. 9 reveals that this polycrystalline orientation film has a network structure.

Example 8

Figure 10:
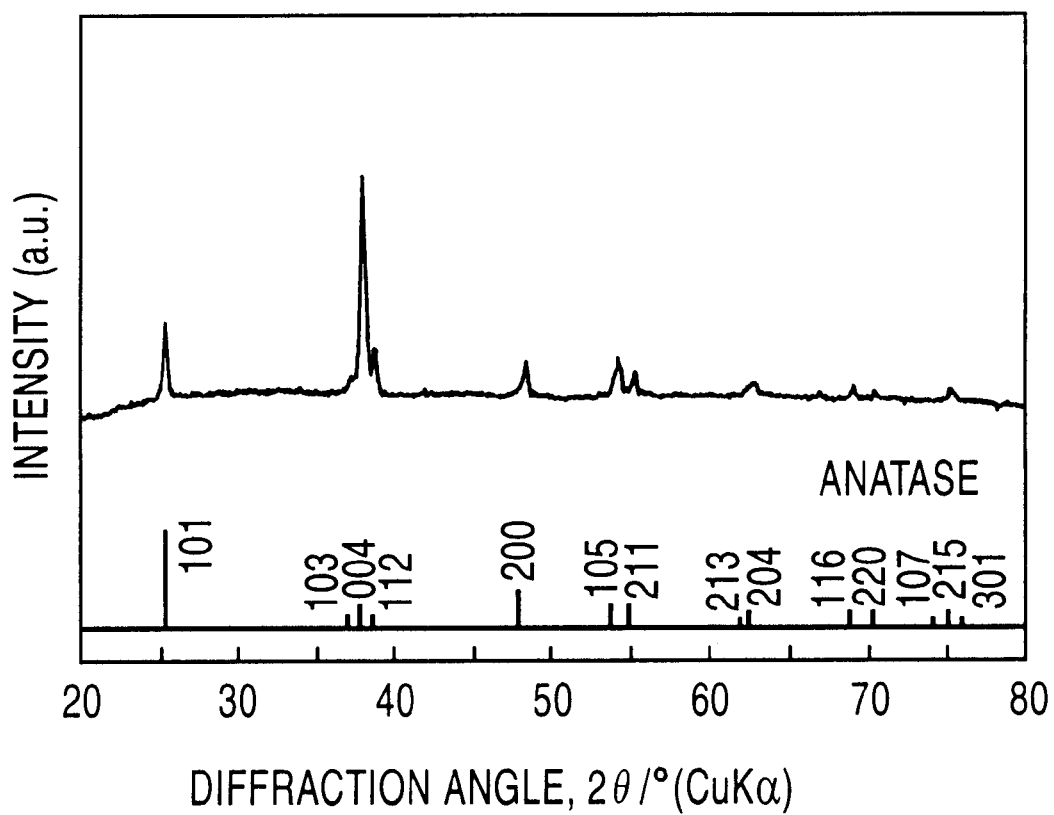
FIG. 10 is an X-ray diffraction pattern of another example of a titanium dioxide polycrystalline orientation film formed on a surface of a material in accordance with the present invention.
Figure 11:
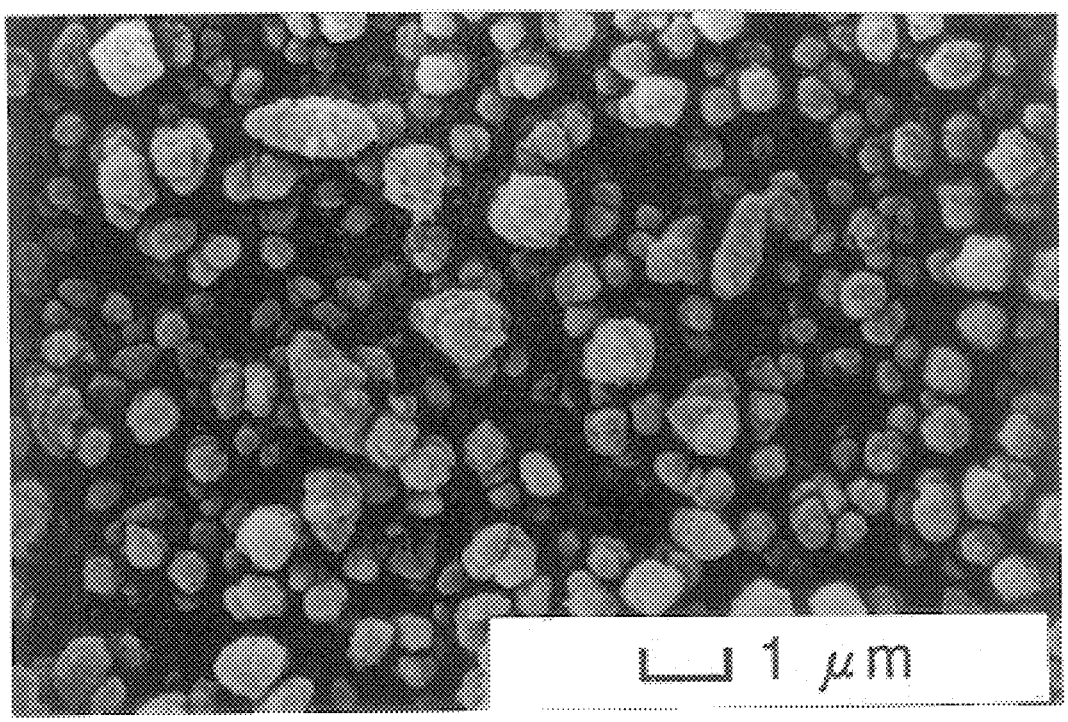
FIG. 11 is a SEM photo of the titanium dioxide polycrystalline orientation film in FIG. 10.

Example 1 was repeated except that a glass substrate having a thickness of 1.0 mm, a width of 26 mm and a length of 76 mm was used as a substrate to form a titanium dioxide polycrystalline orientation film having a thickness of 2.0 μm on the surface of the substrate. The condition of this orientation film was observed using SEM and X-ray diffraction. Consequently, the polycrystalline orientation film had an anatase structure, and was oriented in (001) face at right angles to the surface of the crystal forming the film. Further, the particle diameter of the crystal was between 0.3 and 0.9 μm, and the particle diameter distribution was 0.6±0.3 μm. The results of the X-ray diffraction of this polycrystalline orientation film are shown in FIG. 10, and the SEM photo of the surface in FIG. 11 respectively.

Example 9

Figure 12:
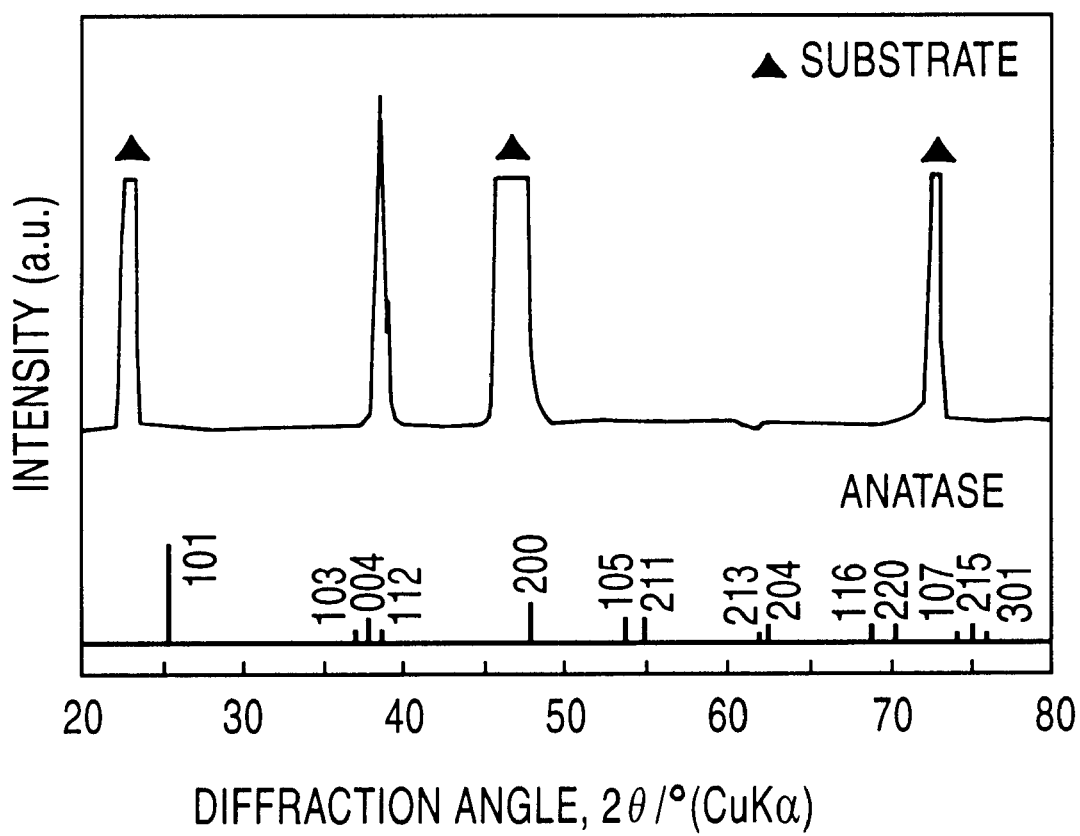
FIG. 12 is an X-ray diffraction pattern of an example of a titanium dioxide single crystalline orientation film formed on a surface of a material in accordance with the present invention.
Figure 13:
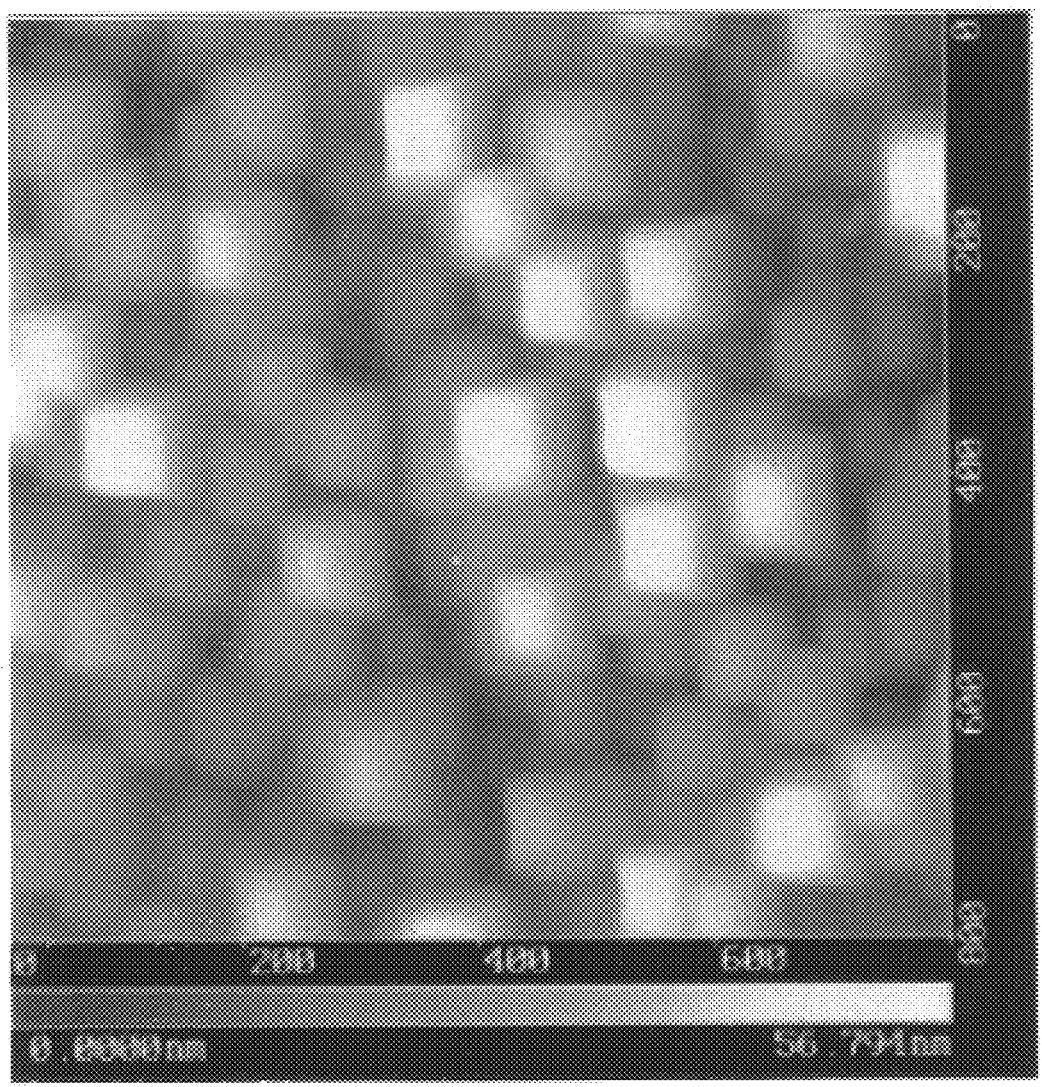
FIG. 13 is an atomic force microscope (hereinafter abbreviated as "AFM") photo of the titanium dioxide polycrystalline orientation film in FIG. 12.

A titanium dioxide crystalline orientation film having a thickness of 2.0 μm was formed on a surface of a substrate in the same manner as in Example 1 except that a single crystalline plate (commercial product) oriented in (100) face and having a thickness of 1.0 mm, a width of 5 mm and a length of 10 mm was used as the substrate, TTIP was used as a starting complex and a starting material vaporization temperature was set at 77° C. The condition of this orientation film was observed using AFM and X-ray diffraction. Consequently, the orientation film had an anatase structure, and was oriented in (001) face at right angles to the surface of the crystal forming the film. It was a single crystalline orientation film formed of plural crystals of which the three-dimensional crystal directions were consistent. The particle diameter of the crystal was between 0.1 and 0.2 μm, and the particle diameter distribution was 0.15±0.05 μm. The results of the X-ray diffraction of this single crystalline orientation film are shown in FIG. 12, and the AFM photo of the surface in FIG. 13 respectively.

Example 10

TTIP was used as a starting complex, and vaporized at a starting material vaporization temperature of 120° C. with a nitrogen gas flow rate of 1.5 l/min. A slide glass having a thickness of 1.0 mm, a width of 26 mm and a length of 76 mm was conveyed as a substrate in a heating oven in which a temperature of a lower-temperature zone was set at 300° C. and that of a higher-temperature zone at 450° C. at a rate of 0.2 m/min. The above-mentioned starting gas mixture was sprayed from a slit-like nozzle having a slit 0.5 mm in width to form a titanium dioxide polycrystalline orientation film having a thickness of 1.0 μm on the surface of the substrate.

Figure 14:
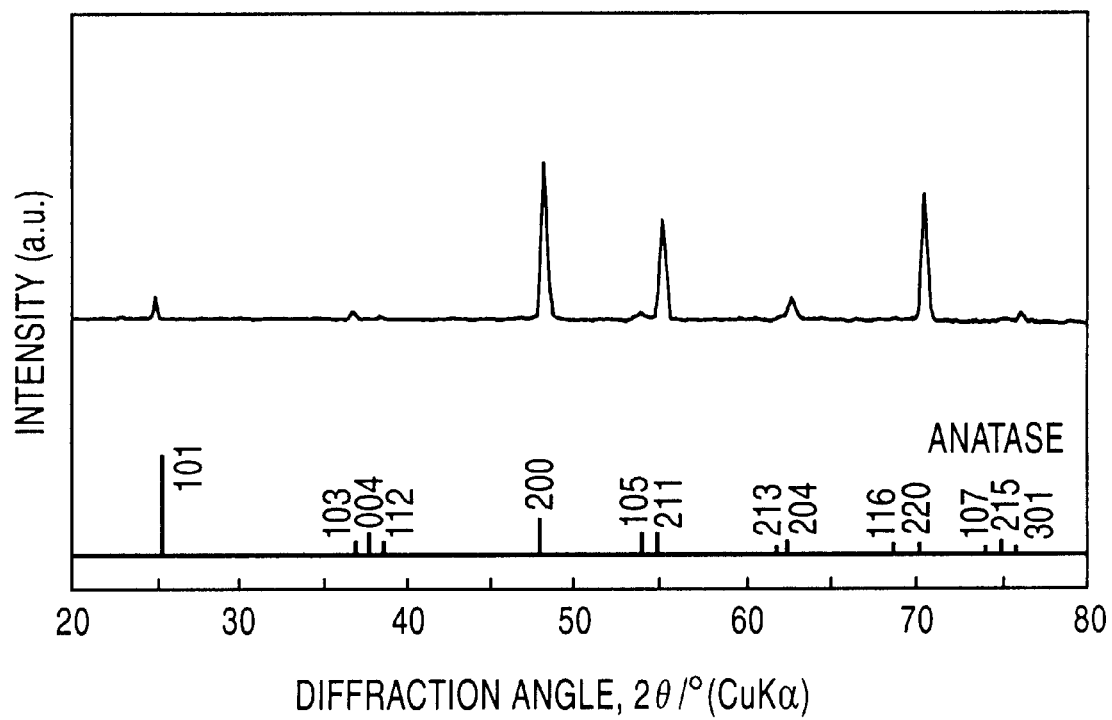
FIG. 14 is an X-ray diffraction pattern of another example of a titanium dioxide polycrystalline orientation film formed on a surface of a material in accordance with the present invention.
Figure 15:
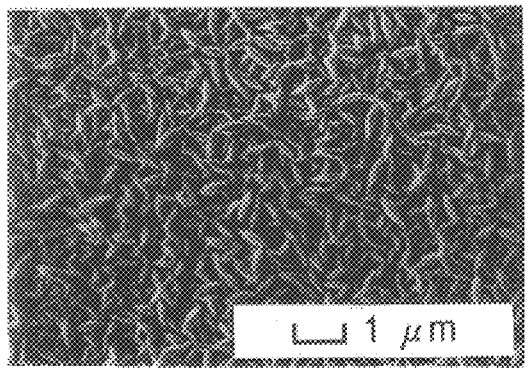
FIG. 15 is a SEM photo of the titanium dioxide polycrystalline orientation film in FIG. 14.

The condition of the titanium dioxide polycrystalline orientation film was observed using SEM and X-ray diffraction. Consequently, the polycrystalline orientation film had an anatase structure, and it had a network structure oriented in (100) face at right angles to the surface of the crystal forming the film. The particle diameter of the crystal was between 0.6 and 0.8 μm, and the particle diameter distribution was 0.7±0.1 μm. The results of the X-ray diffraction of this single crystalline orientation film are shown in FIG. 14, and the SEM photo of the surface in FIG. 15 respectively.

Example 11

The slide glass having the titanium dioxide polycrystalline orientation film obtained in Example 10 was annealed in an oxygen atmosphere at a temperature of 500° C. for 10 hours.

Example 12

Figure 17:
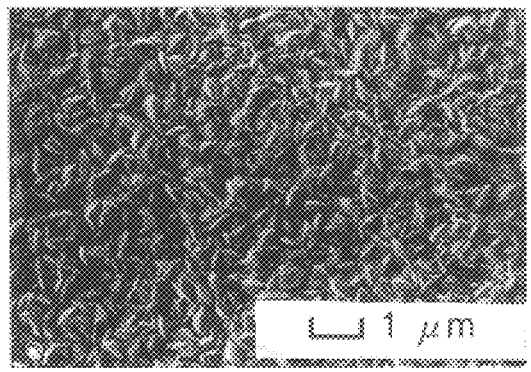
FIG. 17 is a SEM photo of the titanium dioxide polycrystalline orientation film in FIG. 16.
Figure 16:
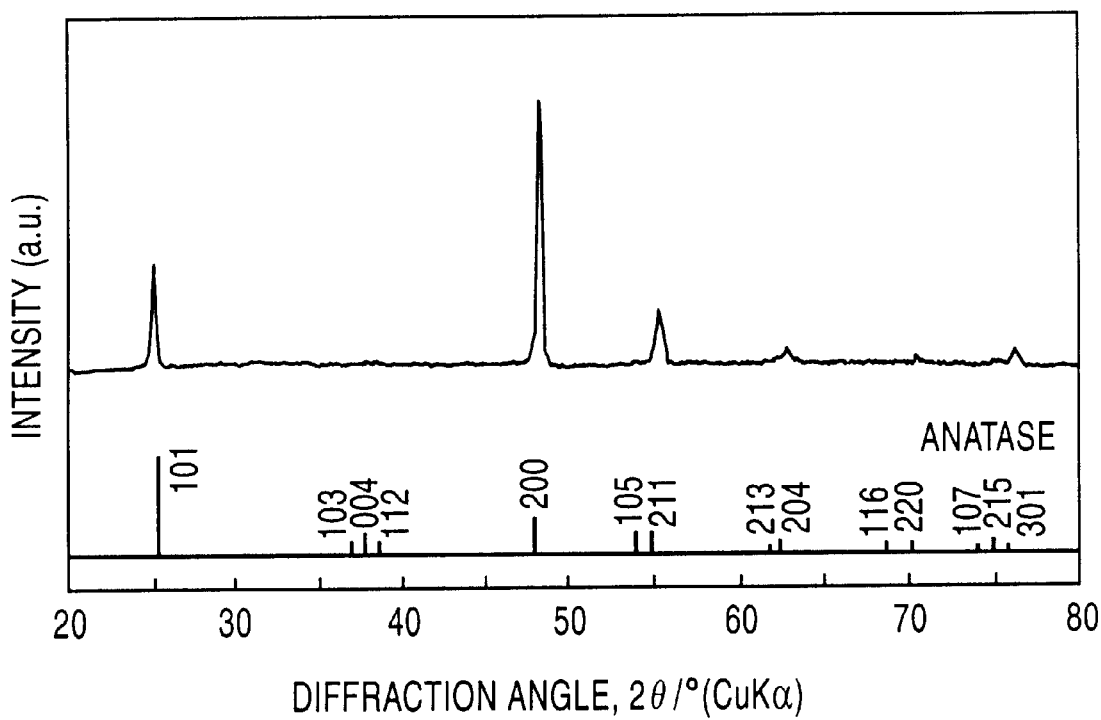
FIG. 16 is an X-ray diffraction pattern of another example of a titanium dioxide polycrystalline orientation film formed on a surface of a material in accordance with the present invention.

A titanium dioxide polycrystalline orientation film having a thickness of 2.0 μm was formed on a surface of a slide glass in the same manner as in Example 10 except that the starting material vaporization temperature was set at 140° C. The condition of this titanium dioxide polycrystalline orientation film was observed using SEM and X-ray diffraction. Consequently, the polycrystalline orientation film had an anatase structure, and it had a particulate structure oriented in (100) face at right angles to the surface of the crystal forming the film. The particle diameter of the crystal was between 0.6 and 0.8 μm, and the particle diameter distribution was 0.7±0.1 μm. The results of the X-ray diffraction of this single crystalline orientation film are shown in FIG. 16, and the SEM photo of the surface in FIG. 17 respectively.

Example 13

The slide glass having the titanium dioxide polycrystalline orientation film as obtained in Example 12 was annealed in an oxygen atmosphere at a temperature of 500° C. for 10 hours.

Example 14

Figure 19:
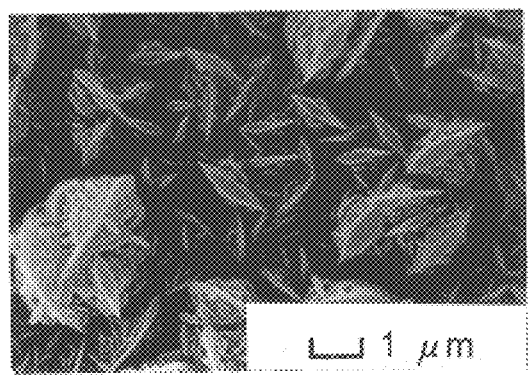
FIG. 19 is a SEM photo of the titanium dioxide polycrystalline orientation film in FIG. 18.
Figure 18:
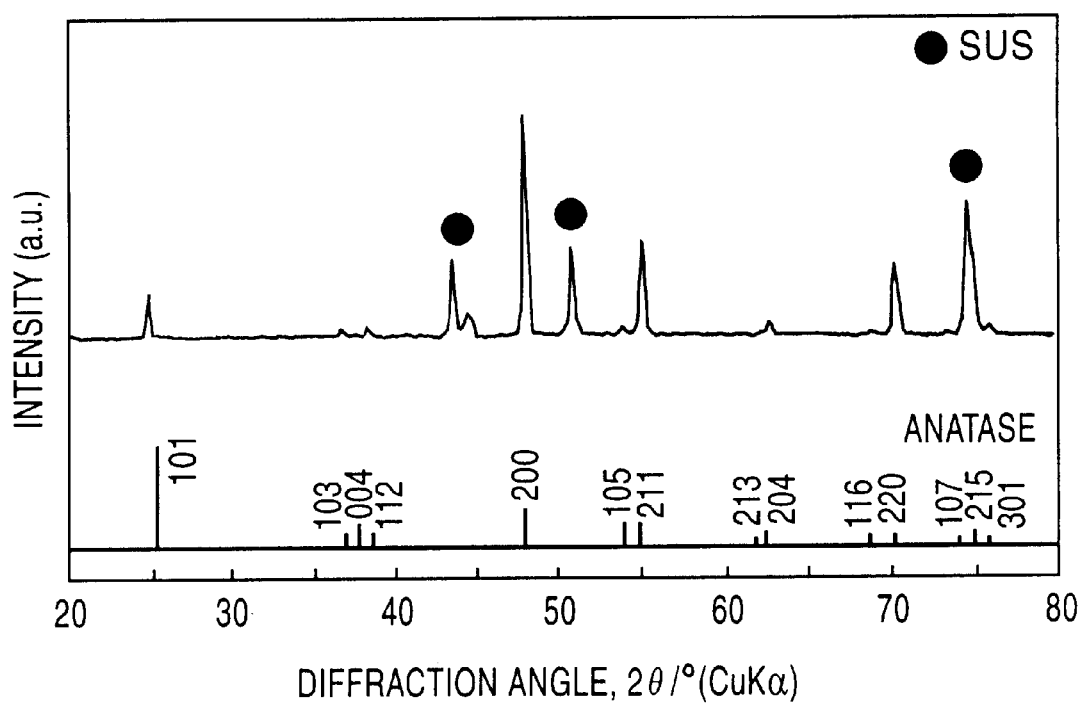
FIG. 18 is an X-ray diffraction pattern of another example of a titanium dioxide polycrystalline orientation film formed on a surface of a material in accordance with the present invention.

A titanium dioxide polycrystalline orientation film having a thickness of 3.0 μm was formed on a surface of a stainless steel in the same manner as in Example 10 except that a stainless steel having a thickness of 0.5 mm, a width of 25 mm and a length of 70 mm was used as a substrate. The condition of this titanium dioxide polycrystalline orientation film was observed using SEM and X-ray diffraction. Consequently, the polycrystalline orientation film had an anatase structure, and was oriented in (100) and (211) faces at right angles to the surface of the crystal forming the film. The particle diameter of the crystal was between 1 and 3 μm, and the particle diameter distribution was 2±1 μm. The results of the X-ray diffraction of this polycrystalline orientation film are shown in FIG. 18, and the SEM photo of the surface in FIG. 19 respectively.

Example 15

The stainless steel having the titanium dioxide polycrystalline orientation film obtained in Example 1 was cut into pieces of 10 mm×10 mm. A silver coating having a thickness of 10 nm was formed on the surface of the titanium dioxide orientation film of this piece at room temperature and a pressure of $10^{-1}$ torr through Ar sputtering using an ordinary CVD apparatus having a closed plating chamber.

Example 16

A stainless steel in which a copper coating 10 nm in thickness was further formed on a surface of a titanium dioxide orientation film was obtained in the same manner as in Example 15 except that copper was used as the starting material of the coating.

Test for an Antimicrobial Activity

Test pieces of 10 mm×10 mm were formed from the substrates each having the titanium dioxide crystalline orientation film on the surface as obtained in the above-mentioned Examples, and the test for the antimicrobial activity was conducted using the same.

General bacteria (*Bacillus subtilis*) which had been grown through liquid culture and of which the number was counted were coated on the above-mentioned test pieces in the order of $10^5$, put on petri dishes, and allowed to stand in a natural light (through a glass window in fine weather) for 3 hours. Then, 9 ml of physiological saline were charged therein, and they were mixed well. According to a usual method (Sanitary Test Method: compiled by Nippon Yakagaku Kai, 1980th edition), a fixed amount of the solution was taken up, and incubated in a standard agar medium at 35° C. for 48 hours. The viable cell number was counted.

For comparison, a stainless steel test piece (Comparative Example 1) and a glass substrate test piece (Comparative Example 2) which were free from a titanium dioxide crystalline orientation film were treated in the above-mentioned manner, and the viable cell number was counted. The results are shown in Table 1.

TABLE 1

| (Test pieces) | (Viable cell number: 1 ml) |
| --- | --- |
| Example 1 | 30> |
| Example 2 | 30> |
| Example 3 | 30> |
| Example 4 | 30> |
| Example 5 | 30> |
| Example 6 | 30> |
| Example 7 | 30> |
| Example 8 | 30> |
| Example 9 | 30> |
| Example 10 | 30> |
| Example 11 | 30> |
| Example 12 | 30> |
| Example 13 | 30> |
| Example 14 | 30> |
| Example 15 | 30> |
| Example 16 | 30> |
| Comp. Ex 1 | $3.2 \times 10^5$ |
| Comp. Ex 2 | $2.9 \times 10^5$ |

Test for a Hydrophilic Property

A water vapor was applied to each of the above-mentioned test pieces through irradiation with a fluorescent lamp, and the condition of the surface thereof was observed. Fine droplets occurred on the surfaces of the test pieces in Comparative Examples 1 and 2, and these test pieces became cloudy. However, no droplet was formed on the surfaces of the test pieces obtained in Examples of the present invention, and these test pieces were uniform aqueous films with no cloudiness.

Example 17

Example 1 was repeated except that a stainless steel having a chromium-plating coating film (a thickness of 1 μm) was used as a substrate to form a titanium dioxide polycrystalline orientation film. This orientation film was 1 μm in thickness, and had the same properties as that in Example 1.

Example 18

A titanium dioxide polycrystalline orientation film was formed on a surface of a pipe in the same manner as in Example 1 except that a stainless steel pipe having an outer diameter of 22 mm and an inner diameter of 18 mm was conveyed as a substrate to the heating oven while being rotated. This orientation film was 0.4 μm in thickness, and had the same properties as that in Example 1.

As stated above, the material having the titanium dioxide crystalline orientation film on the surface of the substrate as obtained by the present invention exhibited the outstanding antimicrobial activity and the various excellent properties. It can widely be used as kitchen appliances such as cooking utensils, tableware and a refrigerator, a refrigeration car, goods for medical care, materials for a toilet or a toilet room, building materials such as interior and exterior materials, road-associated materials, a filter of an air conditioner, electronic parts and the like.

The present invention has succeeded in obtaining a material having properties including an antimicrobial activity for the first time by forming the titanium dioxide crystalline orientation film oriented in the specific direction on the surface of the substrate.

Further, the particle diameter of the titanium dioxide crystals can be adjusted according to the wavelength of from the visible light to the ultraviolet light. The material in which the particle diameter is between 0.1 and 10 $\mu$m, the particle diameter distribution is substantially an average value±100%, above all an average value±50%, the crystalline orientation film has a network structure and annealing is conducted after the formation of the crystalline orientation film, can exhibit quite outstanding properties.

The titanium dioxide crystalline orientation film oriented in the specific direction in the present invention could have been produced for the first time by spraying a titanium alkoxide vaporized onto a substrate heated under atmospheric pressure along with an inert gas as a carrier. The present invention has enabled a titanium dioxide crystalline orientation film on a surface of a long substrate at a high rate by spraying a titanium alkoxide vaporized onto a surface of a substrate leaving a slit-like nozzle under atmospheric pressure along with an inert gas.

The deposition rate of titanium dioxide in the present invention was by far higher than that in the CVD method using the conventional closed plating chamber. Consequently, the orientation direction of the resulting titanium dioxide crystalline film and the crystal structure such as the particle diameter, the particle diameter distribution or the like of the crystal can be controlled, making it possible to obtain a crystalline orientation film almost free from impurities.

Especially when the heating oven for heating the substrate consists of the lower-temperature zones for previously heating the surface of the substrate and the higher-temperature zones for coating titanium dioxide and the partitions were mounted between both zones to prevent the starting gas of the higher-temperature zones from flowing into the lower-temperature zones, the particle diameter, the particle diameter distribution and the like of the crystal can more easily be controlled.

The present invention provides, for the first time, the material having the titanium dioxide crystalline orientation film on the surface and having the above-mentioned outstanding properties, and the method for producing the same. Thus, the present invention has quite a high practical value.

What is claimed is:

1. A method for producing a material having a anatase titanium dioxide crystalline orientation film on a surface of substrate, in which the crystalline orientation film is oriented in the direction such that a crystal face selected from the group consisting of crystal faces (001), (100), (211), (101) and (110) at right angles to a surface of a crystal forming the film, said method comprising spraying a vaporized titanium alkoxide onto the surface of the substrate heated under atmospheric pressure along with an inert gas as a carrier to form the anatase titanium dioxide crystalline orientation film on the surface of the substrate.

2. The method defined in claim 1, in which the inert gas is a nitrogen gas from which moisture has been removed.

3. The method defined in claim 1, in which the vaporized titanium alkoxide is sprayed onto the surface of the substrate from a nozzle having a slit along with the inert gas to continuously form the crystalline orientation film on the surface of the substrate.

4. The method defined in claim 3, in which the surface of the substrate is heated in a heating oven having lower-temperature zones, higher-temperature zones and partitions mounted between both zones, and the surface of the substrate is preliminarily heated in the lower-temperature zones, and titanium dioxide is then coated thereon in the higher-temperature zones.

5. The method defined in claim 1, further comprising a step of annealing in an oxygen atmosphere.

6. A method for producing a material having an anatase titanium dioxide crystalline orientation film, said method comprising:

forming the anatase titanium dioxide crystalline orientation film on the surface of the substrate; and then forming a coating of silver, copper or oxide thereof on said orientation film.

\* \* \* \* \*